United States Patent
Wall

(10) Patent No.: US 12,103,391 B2
(45) Date of Patent: Oct. 1, 2024

(54) SUPPORT DEVICE FOR A DISPLAY HAVING A SWITCHABLE FLEXIBILITY

(71) Applicant: AUDI AG, Ingolstadt (DE)

(72) Inventor: Christian Wall, Hitzhofen (DE)

(73) Assignee: AUDI AG, Ingolstadt (DE)

( * ) Notice: Subject to any disclaimer, the term of this patent is extended or adjusted under 35 U.S.C. 154(b) by 241 days.

(21) Appl. No.: 17/613,582

(22) PCT Filed: May 5, 2020

(86) PCT No.: PCT/EP2020/062359
§ 371 (c)(1),
(2) Date: Nov. 23, 2021

(87) PCT Pub. No.: WO2020/249303
PCT Pub. Date: Dec. 17, 2020

(65) Prior Publication Data
US 2022/0242237 A1 Aug. 4, 2022

(30) Foreign Application Priority Data

Jun. 14, 2019 (DE) ...................... 10 2019 208 725.6

(51) Int. Cl.
*B60K 35/00* (2024.01)
*B60K 35/10* (2024.01)
*B60K 35/22* (2024.01)
*B60K 35/81* (2024.01)

(52) U.S. Cl.
CPC .............. *B60K 35/00* (2013.01); *B60K 35/10* (2024.01); *B60K 35/223* (2024.01); *B60K 35/81* (2024.01); *B60K 2360/1438* (2024.01)

(58) Field of Classification Search
CPC ............ B60K 35/00; B60K 2370/1438; B60K 2370/1533; B60K 2370/52; B60K 2370/158; B60K 2370/688; B60K 37/06; H10K 77/111; H10K 2102/311; Y02E 10/549; G09F 9/301; G06F 2203/04102; G06F 1/1652
See application file for complete search history.

(56) References Cited

U.S. PATENT DOCUMENTS

| | | | |
|---|---|---|---|
| 10,469,635 B1 * | 11/2019 | Carlson | G06F 1/1616 |
| 10,564,682 B1 * | 2/2020 | Wu | H05K 5/0226 |
| 2006/0038745 A1 | 2/2006 | Naksen et al. | |
| 2016/0209877 A1 * | 7/2016 | Chong | H10K 77/111 |
| 2016/0364000 A1 | 12/2016 | Ciesla | |
| 2020/0097044 A1 * | 3/2020 | Kim | B32B 17/067 |
| 2020/0363900 A1 * | 11/2020 | Franklin | G09G 3/3208 |

(Continued)

FOREIGN PATENT DOCUMENTS

| | | |
|---|---|---|
| DE | 10 2006 009 030 B3 | 6/2007 |
| DE | 10 2006 028 049 A1 | 12/2007 |
| EP | 2 958 098 A1 | 12/2015 |

OTHER PUBLICATIONS

Office Action dated Dec. 10, 2019 for German Application No. 10 2019 208 725.6.

(Continued)

*Primary Examiner* — Tracy Y. Li
(74) *Attorney, Agent, or Firm* — STAAS & HALSEY LLP

(57) ABSTRACT

A base support of a display apparatus has a flexible support at least partially delimited by at least one boundary region.

20 Claims, 1 Drawing Sheet

(56) References Cited

U.S. PATENT DOCUMENTS

2020/0383219 A1\* 12/2020 Hale ..................... G06F 1/1641
2021/0068270 A1\* 3/2021 Zhou ..................... G06F 1/1652

OTHER PUBLICATIONS

International Search Report dated Jul. 27, 2020 for International Application No. PCT/EP2020/062359.
EnglishTranslation by WIPO of International Preliminary Report on Patentability dated Jul. 27, 2020 for International Application No. PCT/EP2020/062359, 9 pp.

\* cited by examiner

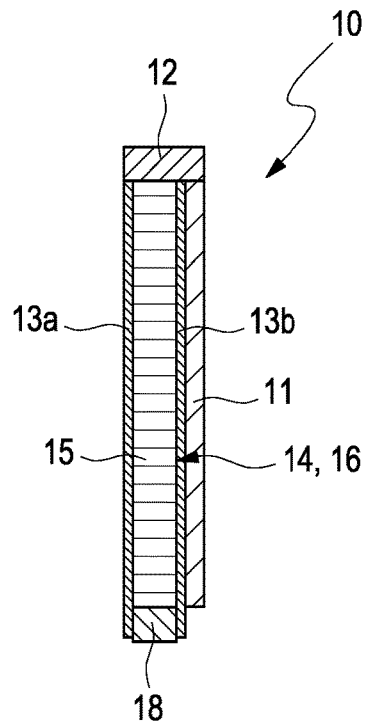 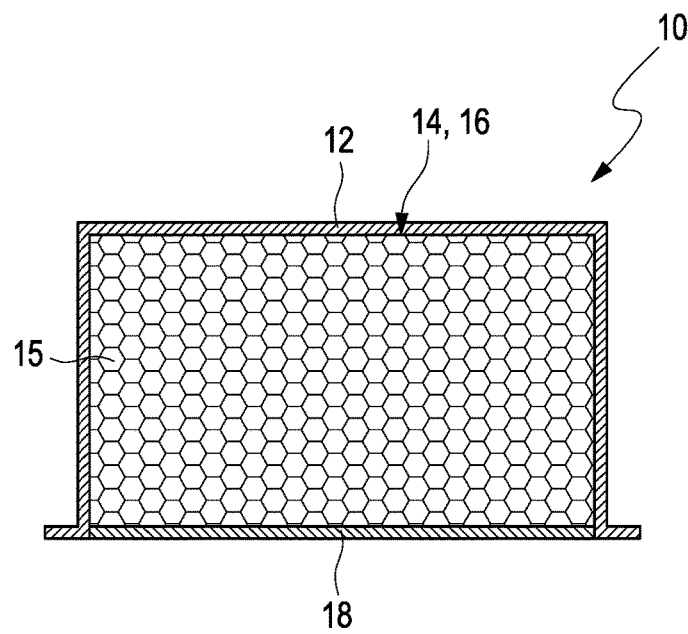
Fig. 1 a
Fig. 1 b
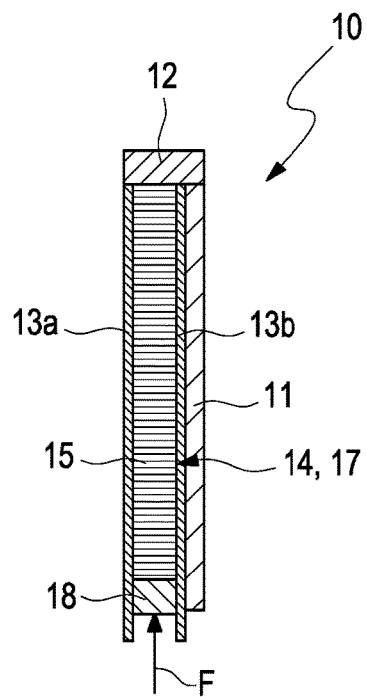 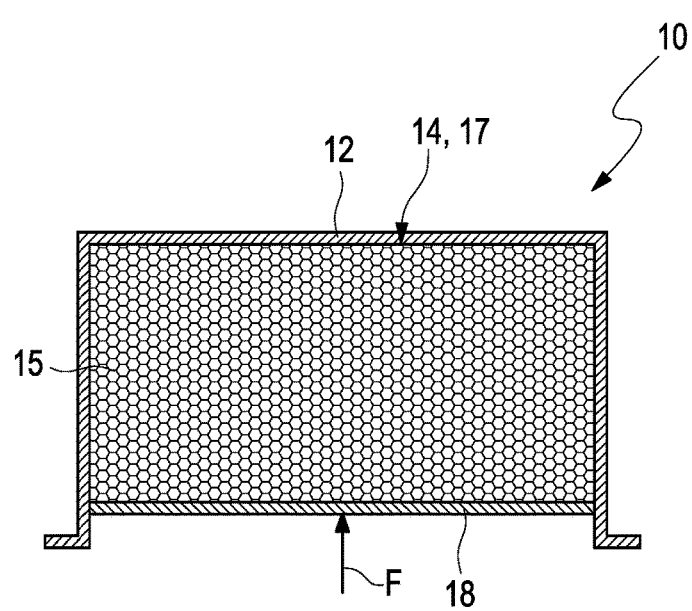
Fig. 2 a
Fig. 2 b

SUPPORT DEVICE FOR A DISPLAY HAVING A SWITCHABLE FLEXIBILITY

CROSS REFERENCE TO RELATED APPLICATIONS

This application is a U.S. national stage of International Application No. PCT/EP2020/062359, filed on May 5, 2020. The International Application claims the priority benefit of German Application No. 10 2019 208 725.6 filed on Jun. 14, 2019. Both the International Application and the German Application are incorporated by reference herein in their entirety.

BACKGROUND

Described below is a support device for a flexible display.

The use of displays is known in many environments at the present time. Displays are generally permanently connected in a rigid manner to a support and a housing. The most recent generation of displays (special organic light-emitting diodes, OLEDs) can also be made flexible, however.

Display devices having flexible displays are known from the related art. For example, a display device for digital image contents is known from document EP 2 958 098 A1. The display device comprises a flexible display, which is arranged on a flexible, inflatable support, which is inflated and stiffened by a compressor. The inflated support can support a display in the inflated state.

A projection device for playing back items of visual information in a vehicle is known from document DE 10 2006 028 049 A1. A display unit of the projection device is made flexible and uses foam elements to inflate automatically if needed. The projection device is a projection surface which consists of a yielding material.

A balloon having a luminescent, planar element and a production method and its use are known from document DE 10 2006 009 030 B3. A flexible balloon is superficially equipped with a flexible display, wherein the balloon is filled with a gas before use. It is therefore the combination of a balloon and a display. The balloon consists of a material which holds helium for a particularly long time.

SUMMARY

Described herein is a device for a flexible display which facilitates operation of the flexible display. The flexible display is generally configured to be deformable, in particular bendable, rollable, or foldable. The flexible display can optionally be deformable in an alternative embodiment.

The support device has a base support, at least one boundary wall, and a flexible support, wherein the base support accommodates the flexible support and wherein the flexible support is at least partially delimited by the at least one boundary wall and wherein the flexible support is designed for the purpose of arranging the flexible display thereon. The support device offers the advantage that a support structure for flexible displays is provided, which is designed and configured in such a way that a mechanically switchable flexibility of the support device can be achieved.

The support device generally includes two boundary walls which are configured to delimit the flexible support. The base support is configured to enclose the flexible support on at least two sides and to accommodate the flexible support. Due to the delimitation of the flexible support by both the base support and also by the two boundary walls, a compression space is provided in which the flexible support is compressible, since the flexible support is delimited from all sides.

In one refinement, one of the boundary walls is configured to accommodate the flexible display. In an alternative embodiment, at least two boundary walls can each accommodate at least one flexible display. Accommodate means here that the flexible display is adhesively bonded on the respective boundary wall or is attached detachably or permanently connected in another manner.

In an alternative embodiment, the flexible display is formed introduced into the boundary wall. The boundary wall can have a recess which is formed corresponding to the dimensions of the flexible display and is configured to at least partially or completely accommodate the flexible display.

In one embodiment, the flexible support is designed and configured as a chamber-like structure and has a mechanical flexibility. The chambers of the chamber-like structure are configured to ensure the required flexibility of the display, in order for example to be able to perform bends and deformations on the display nondestructively. The chamber-like structure generally has offset cavity structures. The individual cavities are built up like bricks in relation to one another. The cavities are generally formed rod-shaped or oblong.

In an alternative embodiment, the cavities are made pentagonal or hexagonal and are arranged like a honeycomb in relation to one another. In a further alternative embodiment, the cavities are made circular or oval, wherein the circular or oval cavities are arranged stacked offset in relation to one another. In general, the structure of the flexible support is mechanically flexible. This means that the structure of the flexible support is deformable or changeable.

In one embodiment, the chamber-like structure is compressible. Compressible means that the chamber-like structure can be compressed. The cavities of the chamber-like structure can be compressed. In general, the chamber-like structure of the flexible support is mechanically compressed. This results in a reversible stiffening of the chamber-like structure and thus in a reversible stiffening of the flexible support. In general, the chamber-like structure is configured to assume the original chamber-like structure again upon decreasing compression.

The chamber-like structure offers, assisted by the offset arrangement of the cavities, the advantage that the chamber-like structure forms a stable composite upon the compression. The flexible support thus forms a hard, rigid underlying surface for the flexible display. This offers the advantage that the flexible display is operable as a touch display due to the solid underlying surface.

In one refinement, the chamber-like structure is compressible by a force applied to the flexible support. For example, the applied force is provided by a compressor. During the compression, the walls of the chamber-like structure of the flexible support are guided toward one another or the walls of the flexible support are compressed. The compressor thus applies a force to the chamber-like structure.

After ending the compression, the chamber-like structure is configured to assume the original shape again, which the chamber-like structure had before the compression. The compressible chamber-like structure can be formed from a yielding soft or flexible material. Alternatively, the compressible chamber-like structure can be formed from a link-like structure, the links of which are configured upon a compression to be collapsible.

In one embodiment, the mechanical flexibility of the flexible support is configured to be switchable, wherein the support device is switched by a switching unit upon a compression of the flexible support into a nonflexible state of the flexible support and is switched into a flexible state of the flexible support upon a decompression of the flexible support. This offers the advantage that a more rigid underlying surface can optionally be formed for the flexible display in specific situations. A more rigid underlying surface offers the advantage that this is mechanically stable to thus enable an operation of the flexible display. The switching unit of the support device is typically configured to switch or control the compressor.

In one refinement, the flexible support is rigid in the nonflexible state and is deformable in the flexible state. Rigid means here that the flexible support has such a hard structure that a touch function of the display is operable. The rigid state is achieved in that the flexible support is compressed. Deformable means that the flexible support has a changeable structure. The structure of the flexible support has this state in the uncompressed state.

The support device has in particular two states, the flexible and the nonflexible state. A combination of the flexible display with a touch operation is possible by the selection between the flexible and the nonflexible state. This offers a high level of comfort for a vehicle occupant. For example, it is possible to stow the flexible display in a space-saving manner by collapsing or rolling when it is not in use. At the same time, the nonflexible state offers the option of providing the flexible display as needed and moreover of enabling a touch operation of the flexible display. The necessity for further operating elements is thus dispensed with, which increases the perception of comfort of the vehicle occupant.

In a further refinement, the flexible support is configured to form a rigid overall assembly in the nonflexible state together with the flexible display arranged thereon. Due to the compression, the flexible support forms the nonflexible state in which the flexible support is not bendable or foldable or rollable. Together with the flexible display, the flexible support in the nonflexible state and the flexible display form the rigid overall assembly. The rigid overall assembly thus forms a linear display which is mechanically stable and is thus touch operable.

In one embodiment, the display is designed as a touch display, wherein the touch display is touch operable in the nonflexible state of the flexible support. Due to the compression of the flexible support, the flexible support forms the nonflexible state. This offers the advantage that a linear surface having a rigidity is achieved which is sufficiently mechanically stable that it is usable for a touch operation.

In one refinement, the compression of the flexible support is actively switchable. The compression of the chamber-like structure is achieved by a mechanical compressor. In general, the compressor is configured to be actively switchable. Actively switchable means that the mechanical compressor is manually activatable as needed. This offers the advantage that a vehicle occupant can actively activate the compression of the flexible support of the support device, so that the flexible display is touch operable. Alternatively, the compression of the flexible support can be configured to be automatically switchable. For example, upon a change to piloted driving, the flexible support can switch automatically into the nonflexible state to prepare the use for the vehicle occupant.

BRIEF DESCRIPTION OF THE DRAWINGS

The schematically illustrated embodiments will be described further with reference to the drawings, wherein identical components are identified by identical reference signs, in which:

FIG. 1a is a cross section through an embodiment of the support device having a flexible support in a flexible state, FIG. 1b is a longitudinal section through the embodiment in FIG. 1a of the support device having the flexible support in the flexible state, FIG. 2a is a cross section through an embodiment of the support device having a flexible support in a nonflexible state, FIG. 2b is a longitudinal section through the embodiment in FIG. 2a of the support device having the flexible support in the nonflexible state.

DETAILED DESCRIPTION

Reference will now be made in detail to the preferred embodiments, examples of which are illustrated in the accompanying drawings, wherein like reference numerals refer to like elements throughout.

FIG. 1a shows a cross section through an embodiment of the support device 10 having a flexible support 14 in a flexible state 16.

FIG. 1a furthermore shows a base support 12 and boundary walls 13a, 13b, the flexible display 11, and a compressor 18. The base support 12 accommodates the flexible support 14 and forms a base structure around the flexible support 14. The flexible support 14 is delimited by the two boundary walls 13a and 13b.

In the present embodiment, the boundary wall 13b is configured to accommodate the flexible display 11. The flexible display 11 is attached to the boundary wall 13b.

The flexible support 14 is designed as chamber-like or has a chamber-like structure 15 at least in regions. The chamber-like structure 15 is designed as rod-shaped, wherein the rod-shaped cavities are arranged laid one on top of another like bricks.

The flexible support 14 is optionally formed from a rigid or bendable material. In general, the flexible support 14 is formed from a rigid material, wherein the flexible support 14 receives or has a mechanical flexibility due to the chamber-like structure 15. This mechanical flexibility is achieved by a compression of the chamber-like structure 15. For example, the chamber-like structure 15 is compressible by a force applied to the flexible support 14.

The mechanical flexibility of the flexible support 14 is switchable, wherein, upon the compression of the flexible support 14, the flexible support 14 is switched into a nonflexible state and, upon a decompression of the flexible support 14, the flexible support 14 is switched into a flexible state 16.

FIG. 1b shows a longitudinal section through the embodiment shown in FIG. 1a of the support device 10 having the flexible support 14 in the flexible state 16. In this case, the flexible support 14 having the base support 12 and the chamber-like structure 15 can be seen. Furthermore, the compressor 18 is shown.

The base support 12 is designed as a receptacle which encloses the chamber-like structure 15 on at least three sides. In the present embodiment, the base support 12 is made rectangular. In alternative embodiments, the base support 12 can have a rounded, circular, or oval shape or form another geometric shape.

FIG. 2a shows a cross section through an embodiment of the support device 10 having a flexible support 14 in a nonflexible state 17.

FIG. 2a also shows—as shown in FIG. 1a—the base support 12 and the boundary walls 13a, 13b, the flexible display 11, and the compressor 18. The base support 12 accommodates the flexible support 14 and forms the base structure 12 around the flexible support 14. The flexible support 14 is delimited by the two boundary walls 13a and 13b.

The boundary wall 13b accommodates the flexible display 11, wherein the flexible display 11 is applied to the boundary wall 13b.

The flexible support 14 is designed as chamber-like and has a mechanical flexibility which is achieved by the compression of the chamber-like structure 15 by the compressor 18.

The mechanical flexibility of the flexible support 14 is switchable, wherein, upon the compression of the flexible support 14, the flexible support 14 is switched into the nonflexible state 17 and, upon the decompression of the flexible support 14, the flexible support 14 is switched into the flexible state 16.

FIG. 2b shows a longitudinal section through the embodiment shown in FIG. 2a of the support device 10 having the flexible support 14 in the nonflexible state 17. The flexible support 14 having the base support 12 and the chamber-like structure 15 can be seen here. Furthermore, the compressor 18 is shown.

The base support 12 is designed as a receptacle which encloses the chamber-like structure 15 on at least three sides. In the present embodiment, the base support 12 is made rectangular.

The compressor 18 compresses the flexible support 14 with the force F. The flexible support 14 is compressed and the flexible support 14 stiffens. Together with the flexible display 11, the rigid, flexible support 14 forms a rigid overall assembly in this nonflexible state, which is sufficiently mechanically stable that it is touch operable.

FIG. 2b shows the flexible support 14 in the nonflexible state 17. The chamber-like structure 15 is compressed by the compressor with the force F. The flexible support 14 is nonflexible due to the compression in such a way that its chamber-like structure 15 stiffens.

Due to the compression, the flexible support 14 is no longer bendable or foldable or rollable. The flexible support 14 in the rigid, nonflexible state 17 forms the rigid overall assembly together with the flexible display 11. The rigid overall assembly forms a linear display 11, which is mechanically stable and is thus touch operable.

The compression of the flexible support 14 is actively switchable. The compression of the chamber-like structure 15 is achieved by the mechanical compressor 18. The mechanical compressor 18 can be manually activated if needed. There is thus the selection between a flexible display 11 in a flexible state 16—shown in FIG. 1a—which can be easily stowed and a flexible display 11 in a nonflexible state 17, in which the display 11 is touch operable.

LIST OF REFERENCE SIGNS 10 support device
11 flexible display
12 base support
13a, 13b boundary region
14 flexible support
15 chamber-like structure
16 flexible state
17 nonflexible state
18 compressor
F force.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide v. DIRECTV*, 358 F3d 870, 69 USPQ2d 1865 (Fed. Cir. 2004).

The invention claimed is:

1. A support device for a flexible display, comprising:
   a base support;
   at least one boundary wall; and
   a flexible support, accommodated by the base support and at least partially delimited by the at least one boundary wall, configured to support the flexible display thereon, the flexible support including a chamber-like structure and rod-shaped cavities, wherein the rod-shaped cavities are arranged one on top of another, each of the rod-shaped cavities being in contact with at least another of the rod-shaped cavities.

2. The support device as claimed in claim 1, wherein one of the boundary walls is configured to accommodate the flexible display.

3. The support device as claimed in claim 2, wherein the flexible support has mechanical flexibility.

4. The support device as claimed in claim 3, wherein the chamber-like structure is compressible.

5. The support device as claimed in claim 4, wherein the chamber-like structure is compressible by a force applied to the flexible support.

6. The support device as claimed in claim 5,
   further comprising a switching unit configured to switch the mechanical flexibility of the flexible support, and
   wherein upon compression of the flexible support, the flexible support is switched into a nonflexible state and, upon decompression of the flexible support, the flexible support is switched into a flexible state.

7. The support device as claimed in claim 6, wherein the flexible support is rigid in the nonflexible state and is deformable in the flexible state.

8. The support device as claimed in claim 7, wherein the flexible support is configured, in the nonflexible state, to form a rigid overall assembly together with the flexible display arranged thereon.

9. The support device as claimed in claim 8, wherein the display is a touch display operable in the nonflexible state of the flexible support.

10. The support device as claimed in claim 9, wherein the compression of the flexible support is actively switchable.

11. The support device as claimed in claim 1, wherein the flexible support has mechanical flexibility.

12. The support device as claimed in claim 11, wherein the chamber-like structure is compressible.

13. The support device as claimed in claim 12,
    further comprising a switching unit configured to switch the mechanical flexibility of the flexible support, and
    wherein upon compression of the flexible support, the flexible support is switched into a nonflexible state and, upon decompression of the flexible support, the flexible support is switched into a flexible state.

14. The support device as claimed in claim 12, wherein the flexible support is rigid in the nonflexible state and is deformable in the flexible state.

15. The support device as claimed in claim 12, wherein the compression of the flexible support is actively switchable.

16. The support device as claimed in claim 11, wherein the chamber-like structure is compressible by a force applied to the flexible support.

17. The support device as claimed in claim 16,
further comprising a switching unit configured to switch the mechanical flexibility of the flexible support, and
wherein upon compression of the flexible support, the flexible support is switched into a nonflexible state and, upon decompression of the flexible support, the flexible support is switched into a flexible state.

18. The support device as claimed in claim 11,
further comprising a switching unit configured to switch the mechanical flexibility of the flexible support, and
wherein upon compression of the flexible support, the flexible support is switched into a nonflexible state and, upon decompression of the flexible support, the flexible support is switched into a flexible state.

19. The support device as claimed in claim 18, wherein the flexible support is configured, in the nonflexible state, to form a rigid overall assembly together with the flexible display arranged thereon.

20. The support device as claimed in claim 1, wherein the display is a touch display operable in the nonflexible state of the flexible support.

\* \* \* \* \*